United States Patent
Xiao et al.

(10) Patent No.: US 11,087,049 B2
(45) Date of Patent: Aug. 10, 2021

(54) ONLINE SELF-DRIVING CAR VIRTUAL TEST AND DEVELOPMENT SYSTEM

(71) Applicant: Hitachi, Ltd., Tokyo (JP)

(72) Inventors: Yuan Xiao, Northville, MI (US); Sujit Phatak, New Hudson, MI (US); Heming Chen, Novi, MI (US); Sanketh Shetty, Farmington Hills, MI (US)

(73) Assignee: Hitachi, Ltd., Tokyo (JP)

( * ) Notice: Subject to any disclaimer, the term of this patent is extended or adjusted under 35 U.S.C. 154(b) by 301 days.

(21) Appl. No.: 16/201,441

(22) Filed: Nov. 27, 2018

(65) Prior Publication Data
US 2020/0167436 A1  May 28, 2020

(51) Int. Cl.
*G06F 30/20* (2020.01)

(52) U.S. Cl.
CPC .................. *G06F 30/20* (2020.01)

(58) Field of Classification Search
CPC ............ G06F 30/20; G06F 30/15; G09B 9/05
See application file for complete search history.

(56) References Cited

U.S. PATENT DOCUMENTS

| | | | | |
|---|---|---|---|---|
| 10,816,978 | B1 * | 10/2020 | Schwalb | G05D 1/0088 |
| 10,831,202 | B1 * | 11/2020 | Askeland | G05D 1/0088 |
| 2007/0030171 | A1 * | 2/2007 | Cheevarunothai | G08G 1/0104 340/941 |
| 2013/0125028 | A1 * | 5/2013 | Pearson | G09B 9/00 715/757 |
| 2016/0203727 | A1 * | 7/2016 | White | G09B 5/02 434/219 |
| 2016/0210775 | A1 * | 7/2016 | Alaniz | G05D 1/0088 |
| 2017/0161414 | A1 | 6/2017 | Kible et al. | |
| 2019/0009175 | A1 * | 1/2019 | Buxton | G09B 9/04 |
| 2019/0019087 | A1 * | 1/2019 | Fukui | G06K 9/6273 |
| 2019/0303759 | A1 * | 10/2019 | Farabet | G06K 9/4628 |
| 2019/0322286 | A1 * | 10/2019 | Stefan | G06F 30/15 |
| 2020/0012756 | A1 * | 1/2020 | Ma | G06F 30/20 |
| 2020/0364953 | A1 * | 11/2020 | Simoudis | G07C 5/008 |

OTHER PUBLICATIONS

Chen et al. (Autonomous Vehicle Testing and Validation Platform: Integrated Simulation System with Hardware in the Loop*,IEEE, Jun. 2018) (Year: 2018).*
Zofka et al., Simulation Framework for the Development of Autonomous Small Scale Vehicles (Year: 2016).*
Huang et al, Autonomous Vehicles Testing Methods Review (Year: 2016).*
Bhadani et al., The cat vehicle test bed: a simulator with hardware in the loop for autonomous vehicle applications (Year: 2018).*
Chen et al. , Cognitive Map-based Model: Toward a Developmental Framework for Self-driving Cars (Year: 2018).*

* cited by examiner

*Primary Examiner* — Mohammad K Islam
(74) *Attorney, Agent, or Firm* — Procopio, Cory, Hargreaves & Savitch LLP

(57) ABSTRACT

Example implementations described herein facilitate an interactive environment for companies and personals to validate and develop autonomous driving systems. Such implementations apply to, but are not limited to, applications such as sensor data collection for deep learning model training; validation and development of various detection algorithms; sensor fusion (e.g., radar, lidar, camera) algorithm development and validation, trajectory/motion planning algorithm validation; and control algorithm validation.

17 Claims, 7 Drawing Sheets

ONLINE SELF-DRIVING CAR VIRTUAL TEST AND DEVELOPMENT SYSTEM

BACKGROUND

Field

The present disclosure relates to advance driver-assistance systems (ADAS), and more specifically, to online self-driving car virtual test and development systems.

Related Art

An automated driving system is a complex combination of various electrics and machinery components, which affect perception, decision making, and operation of the automobile. Autonomous driving systems will require several billion miles of test driving to prove that the systems have the capability to drive safely, economically, and better than human drivers. A fleet of 20 test vehicles can cover only a million miles in an entire year. There are 4.12 million miles of roads in the US alone. Due to such circumstances, simulation of roads improves testing efficiency, safety and comprehensiveness.

As for autonomous driving system development, deep learning has been used in self-driving cars to process sensory data and make informed decisions, the applications include lane detection, pedestrian detection, road sign recognition, traffic light detection, obstacle detection, environment recognition, human action recognition, and so on. To train deep learning neural networks, a large amount of sensor data is necessary. Road tests will consume lots of resources including data regarding the test vehicle, specific sensor set, test drivers, and so on. Further, such deep learning neural networks can be very inefficient since they require a long and expensive cycle time to generate new datasets that are relevant and correctly labelled. Simulations can facilitate several advantages compared to the traditional physical road test, such as the ability to generate new sensor data set continuously, generate labelled sensor data using ground truth information automatically, and so on.

Since there is a need for autonomous driving simulation of self-driving car test and development, related art implementations of simulation tools have been developed. In a related art implementation, there is a method for validating the driver assistance function of a motor vehicle, including operating an automated vehicle object in an electronic simulation environment using a vehicle model and the driver assistance function, wherein the automated vehicle object is operated in the simulation environment together with at least one other vehicle object, the at least one other vehicle object being controlled by a human being.

SUMMARY

However, related art solutions suffer from a lack of accessibility since they require users to build the simulation environment in the first place. At the same time, the related art solutions utilize standard traffic models to imitate traffic, such as cellular automata model and car-following models which suffer from a lack of fidelity and are not able to forecast the actual case compared to real human driver behavior.

Therefore, example implementations involve the online self-driving car test and development system to overcome such problems with the related art.

In example implementations described herein, an online central simulation environment is proposed, wherein many "vehicle model" with different algorithms and sensors models developed by different developers can conduct their drive test. Example implementations involve a method to test and develop ADAS functionality of a vehicle interactively with other vehicles.

The targeted vehicle that subject to test/develop will be abstracted as a detailed vehicle model with sensor model, vehicle dynamics model, control module, and a planning module in a local simulation environment. It will be simulated with other vehicle data populated by the central simulation engine system on a cloud.

Other vehicles can also be abstracted as detailed vehicle models in their own local simulation environments. All vehicle data will be sent and processed in a central simulation engine and the processed data will be sent back to each local environment.

Aspects of the present disclosure involve a method, which involves receiving first model data from a first user to simulate a vehicle; utilizing an environment server to render a 3D environment based on the first model data; utilizing an experiment server to execute a simulation session to simulate the vehicle on the 3D environment based on the first model data; providing virtual sensor data output from the simulation session; and managing the simulation session in a database to be available to subsequent users submitting second model data to simulate another vehicle.

Aspects of the present disclosure involve a computer program, storing instructions which involves receiving first model data from a first user to simulate a vehicle; utilizing an environment server to render a 3D environment based on the first model data; utilizing an experiment server to execute a simulation session to simulate the vehicle on the 3D environment based on the first model data; providing virtual sensor data output from the simulation session; and managing the simulation session in a database to be available to subsequent users submitting second model data to simulate another vehicle. The instructions of the computer program can be stored on a non-transitory computer readable medium and executed by one or more processors.

Aspects of the present disclosure involve a system, which involves means for receiving first model data from a first user to simulate a vehicle; means for rendering a 3D environment based on the first model data; means for executing a simulation session to simulate the vehicle on the 3D environment based on the first model data; means for providing virtual sensor data output from the simulation session; and means for managing the simulation session to be available to subsequent users submitting second model data to simulate another vehicle.

Aspects of the present disclosure involves a system, involving a communication server configured to receive first model data from a first user to simulate a vehicle; an environment server configured to render a 3D environment based on the first model data; an experiment server configured to execute a simulation session to simulate the vehicle on the 3D environment based on the first model data; and a database configured to manage the simulation session in a database to be available to subsequent users submitting second model data to simulate another vehicle, wherein the communication server provides virtual sensor data output from the simulation session of the experiment server to a client device associated with the first user.

DETAILED DESCRIPTION

Figure 1:
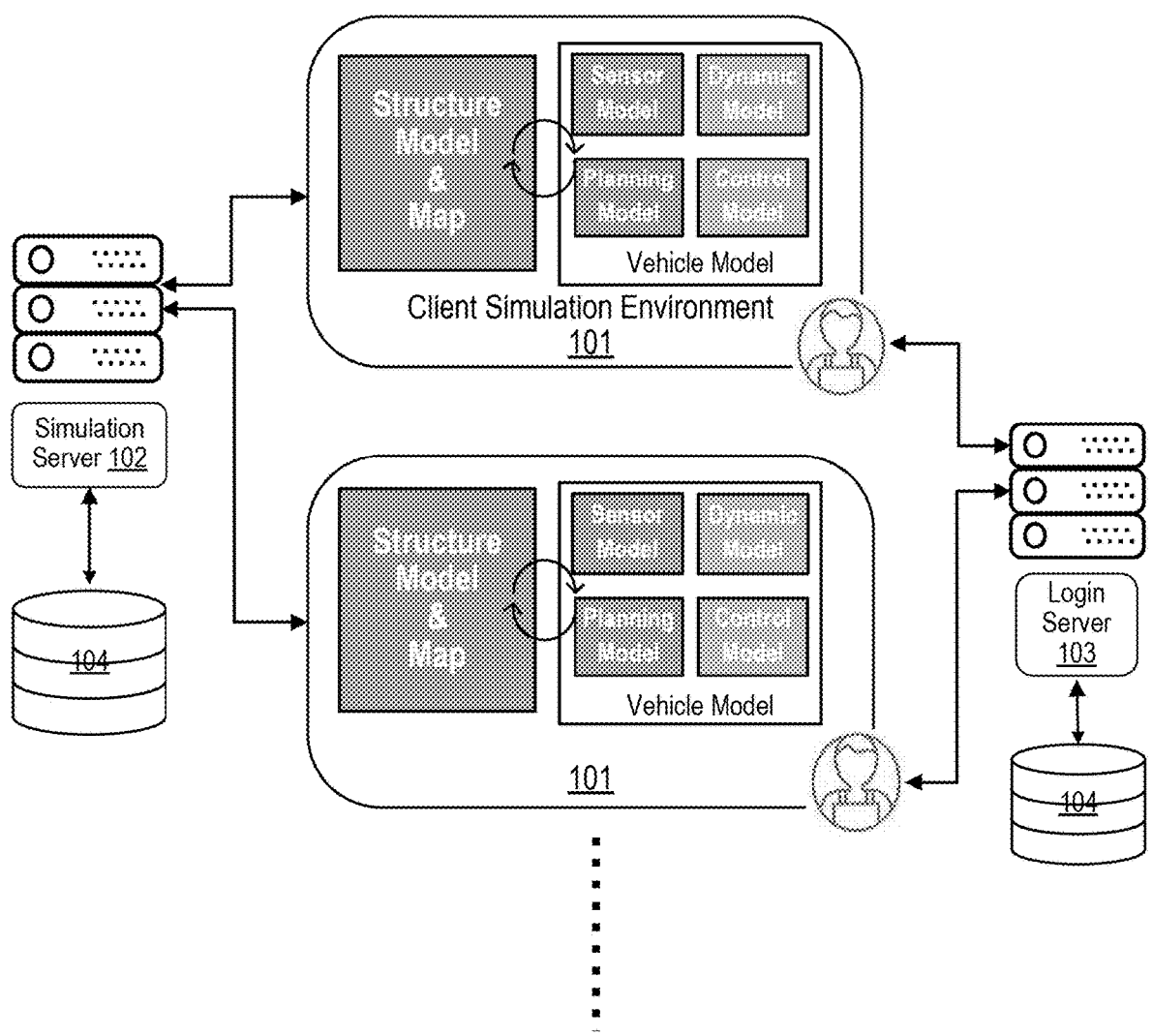
FIG. 1 illustrates the overall architecture of the online self-driving car test and development system.

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application. Selection can be conducted by a user through a user interface or other input means, or can be implemented through a desired algorithm. Example implementations as described herein can be utilized either singularly or in combination and the functionality of the example implementations can be implemented through any means according to the desired implementations.

FIG. 1 illustrates the overall architecture of the online self-driving car test and development system, in accordance with an example implementation. The system involves four major parts: client simulation environment 101, simulation server 102, login server 103, and database 104. The client simulation environment 101 will be running on the users' machine. The other servers 102, 103 and the database 104 will be run on physical central server or cloud infrastructure. Each part communicates with each other through an internet connection.

Figure 2:
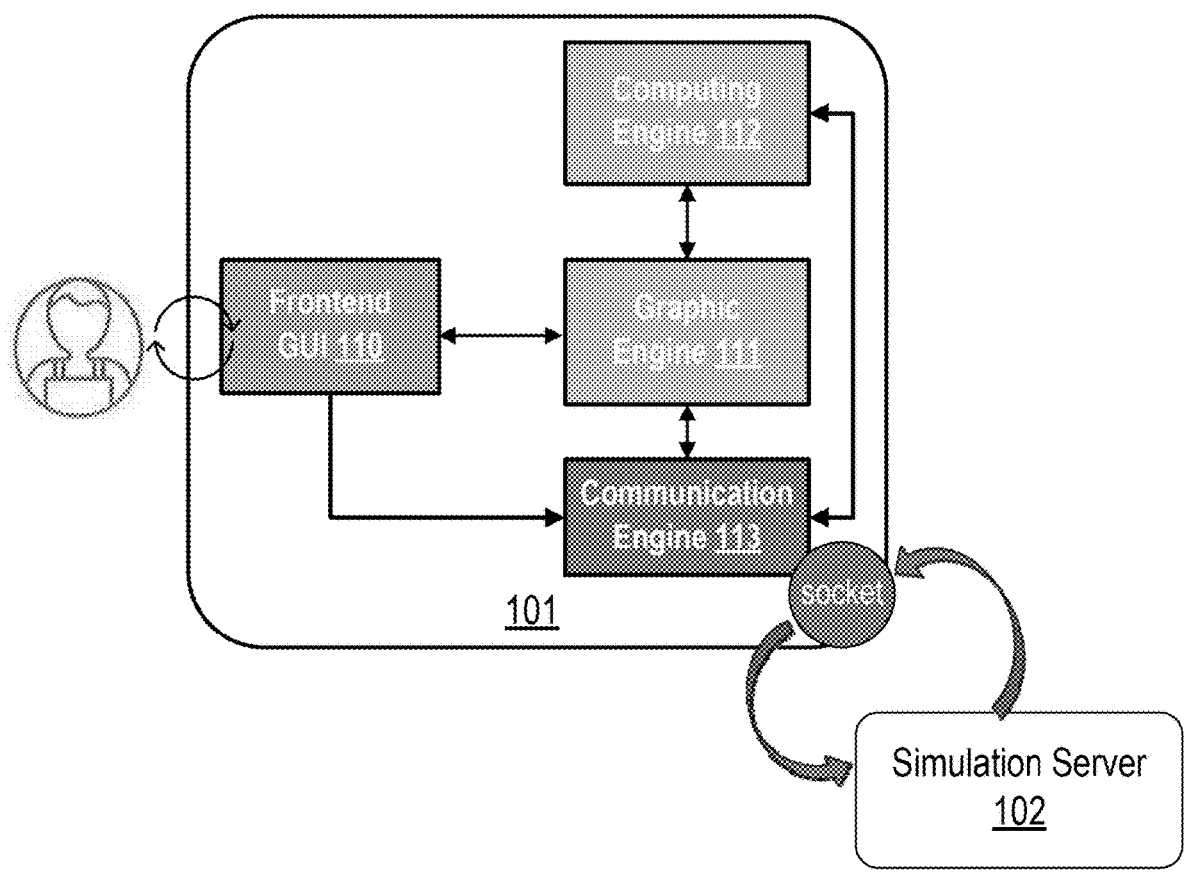
FIG. 2 illustrates a client simulation environment, in accordance with an example implementation.

FIG. 2 illustrates a client simulation environment 101, in accordance with an example implementation. The client simulation environment will be running on users' local device. As seen in FIG. 2, there is a standard interface for users to build the vehicle model and select structure model, rending graphics and animation from simulation server as well as establishing internet connection between client and server.

The frontend Graphical User Interface (GUI) 110 and processor receive the command from users and send the message to graphic engine 111, computing engine 112 or communication engine 113 based on different types of requests. For example, to select a baseline vehicle model, if the vehicle data is not stored in the local database, the frontend processor will send the message to the communication engine, and the communication engine will send the message to simulation server and rending the graphics and animation to graphic engine and display in the frontend eventually.

The graphic engine 111 is used to render graphics and animations either from the local database or from the remote database through the communication engine 113 and the simulation server.

The communication engine 113 serves as a bridge from the local environment and remote server. Its main functionality is to route messages from the client simulation environment to the simulation server 102.

The computing engine 112 will pull user command from frontend GUI 110 and process it. For example, if user moves the vehicle himself/herself, it will calculate the location of the vehicle at the next time step according to user's input.

The simulation server 102 facilitates the core functionality of virtual driving test. The architecture is involves several functional servers in a cloud system to ensure there is no latency when several users interact with each other, as well as for ensuring that the system runs seamlessly in terms of server failure.

Figure 3:
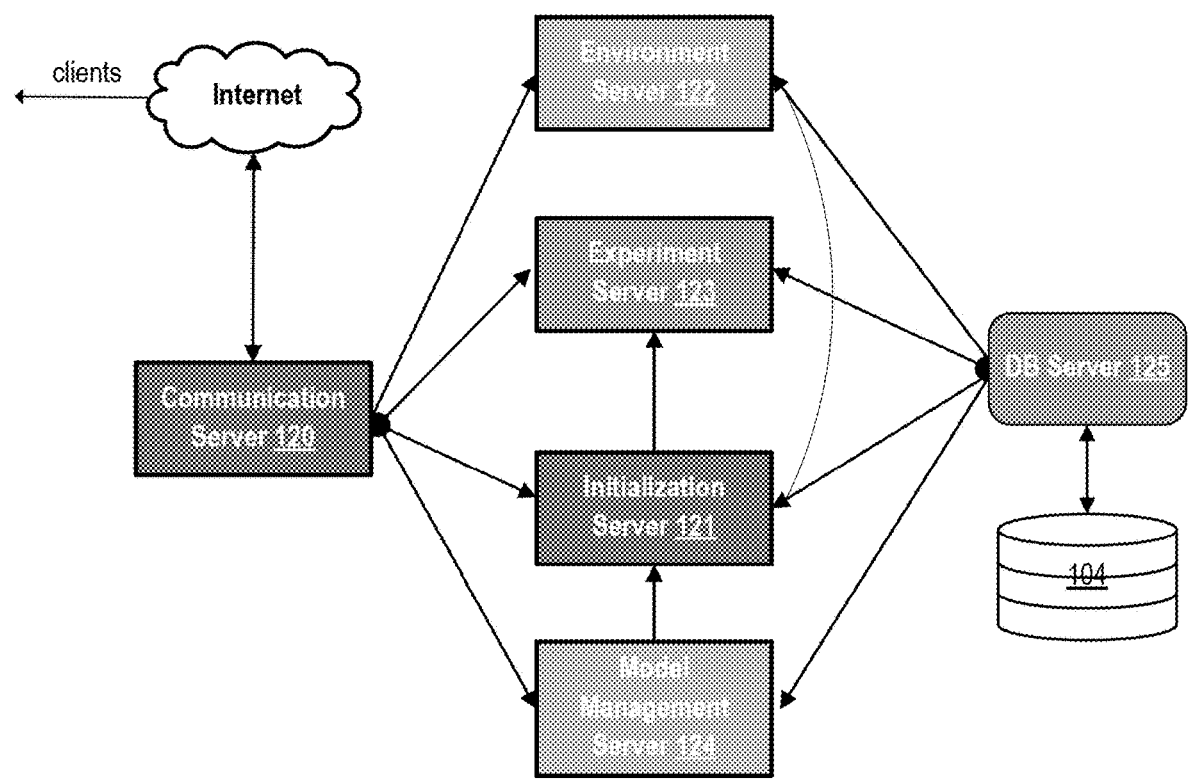
FIG. 3 illustrates the architecture of the simulation server, in accordance with an example implementation.

FIG. 3 illustrates the architecture of the simulation server 102, in accordance with an example implementation. The simulation server 102 involves several servers configured to conduct dedicated functions, such as a communication server 120, initialization server 121, environment server 122, experiment server 123, model management server 124 and database server 125.

The communication server 120 is configured to manage communications from the client devices. All routing messages between the clients and other functional servers as well as message encryption are handled by the communication server 120. The example implementations described herein can be implemented on a communications server 120 configured to facilitate communications between a client device and the environment server 122, the experiment server 123 and the database 125.

When user launches the client environment, the client device will connect to one of the initialization servers 121. The initialization server 121 is configured to direct users to the right environment. For example, the users will need to select which test environment with structure models they want to test their virtual vehicle on. It will create the new test environment and place them on servers or create new servers in cloud environments.

The test environment with structure models at certain states are executed on environment server 122. The state will be affected by user action in real time and changes to the state will be shown to all users.

The experiment server 123 is used to process user requests to run a standalone virtual driving test, without having the driving test interact with other users. Functionality is similar to the environment server, however the experiment server 123 but it will not render other user states.

The model management server 124 is used to handle the physical vehicle models, structure models and maps stored in the database. It will process users' request on uploading, downloading, and pulling the model.

Database server 125 handles access to the vehicle physics and structure model database.

Additionally, depending on the desired implementation, the simulation server 102 can also involve a login server configured to validate user information and security.

As illustrated in FIG. 3, the functions of the simulation server 102 are divided into dedicated servers to serve their particular function in order to reduce latency and to reduce the amount of time taken to execute a simulation or render a 3D environment. Such implementations are utilized in order to facilitate a cloud service that can provide computationally expensive simulations and 3D renderings involving vehicle simulations that require an immense amount of data to simulate accurately. Further, such dedicated functions as implemented in individual servers reduce the latency between the client device and the simulation as the communication server 120 is dedicated to facilitating the communications between the client device and the simulation. Each server may be implemented on a platform as illustrated FIG. 7, however, dedicated hardware such as Graphics Processing Units (GPU), Field Programmable Gate Arrays (FPGAs), tensor units or other forms of dedicated hardware may be employed on each server to assist in addressing the computational complexity involved in the simulation of vehicles.

Figure 4:
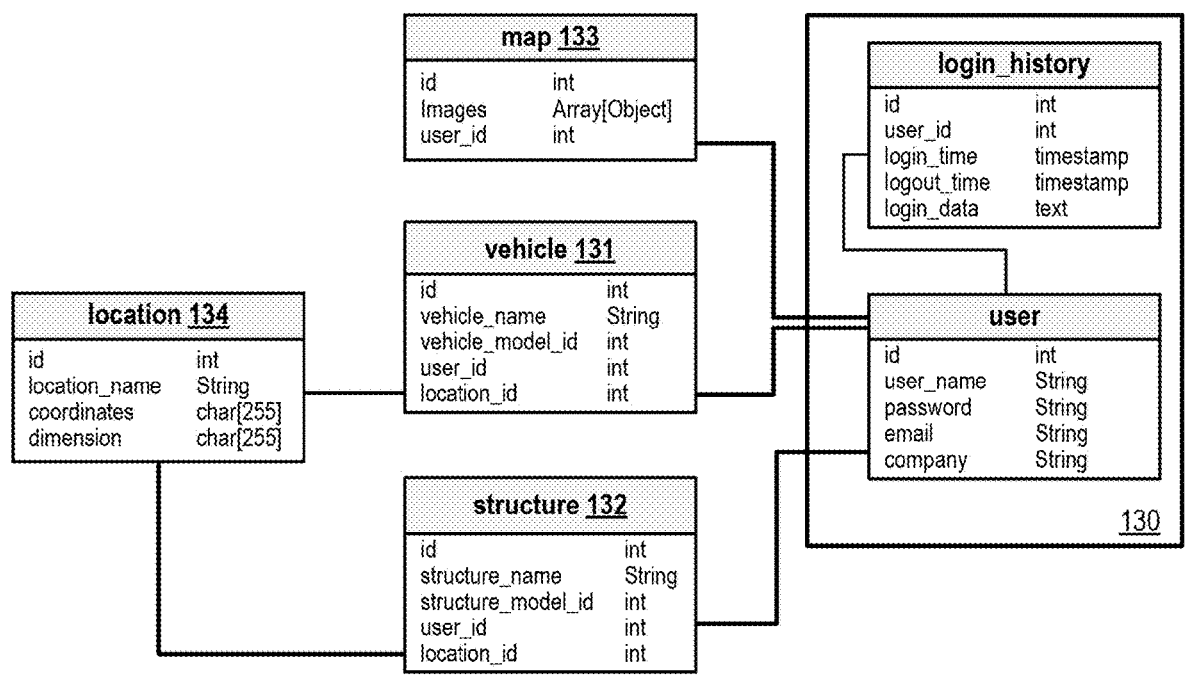
FIG. 4 illustrates examples of a key database structure for the online test system, in accordance with an example implementation.

FIG. 4 illustrates examples of a key database structure for the online test system, in accordance with an example implementation.

The database 104 for the system stores user data 130, vehicle physics model data 131, structure model data 132, various map data 133 and other metadata, according to the desired implementation. The 3D map data is rendered by the simulation server based on user selection.

The vehicle physics model data 131 contains information to model the vehicle physics, such as acceleration information, turning radius, vehicle features and others in accordance with the desired implementation. The structure model data 132 contains information for modeling a particular object in a 3D environment (e.g., a building, a tree, a light post, etc.) in accordance with the desired implementation. The map data 133 includes information regarding the actual map of the environment that is to be rendered (e.g., object locations in a particular roadway, the particular set of streets to be simulated, etc.) Location data 134 is also calculated by the simulation server according to the vehicle initial location, speed, direction and map.

Figure 5:
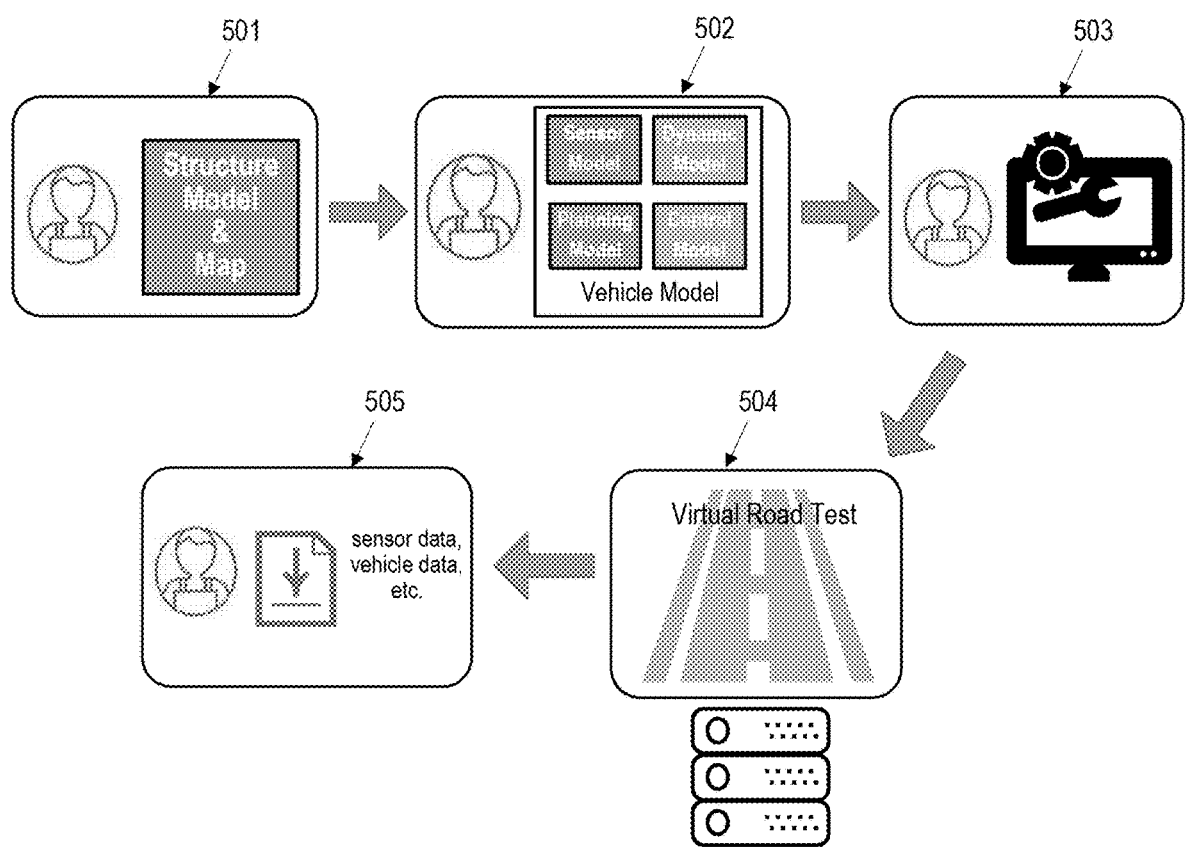
FIG. 5 illustrates an example step for utilizing the system for test and development, in accordance with an example implementation.

FIG. 5 illustrates an example step for utilizing the system for test and development, in accordance with an example implementation. At 501, after the login process is complete, a map and related structure model is selected in either standalone or interactive mode. At 502, an interface is provided to configure the vehicle model, to facilitate the selection of the preconfigured vehicle type and input customized sensor data or upload a complete new vehicle mode based on own needs. At 503, a virtual test run configuration is provided in an interface. The interface can facilitate configurations as to the desired output (e.g., camera images, radar or lidar data, vehicle dynamic data), that can then be downloaded after the virtual test run. The interface also facilitates selections as to whether the test run or is to be manually started and terminated, or if it is to be scheduled to run automatically at a certain time frame. At 504, the test run can be executed, whereupon the test run can be terminated manually, or the system will execute according to the scheduled run. At 505, the data is provided for download that can then be configured for further processes.

In example implementations described herein, compared to the related art road test systems for autonomous driving system, the example implementations provide technological improvements over the related art by facilitating the generation of sensor data sets continuously for algorithm development, reducing the time and effort needed to validate and develop autonomous functions, facilitate the integration of a new environment and vehicle model on demand, provide ground truth data that is available for labeling; and combines real and simulated data for more robust training and validation.

In contrast to existing related art ADAS simulation software, example implementations provide several technological improvements, including requiring less effort for the developer to extend the simulation database by themselves as shared resources are available; facilitate high fidelity tests with interactions with other autonomous driving car developers; reduction of configuration time and elimination of the need of high performance hardware as the computational load is taken care by remote server; and the structure models are also available for modifications to provide for vehicle to vehicle (V2V) and vehicle to computer (V2C) test.

Figure 6:
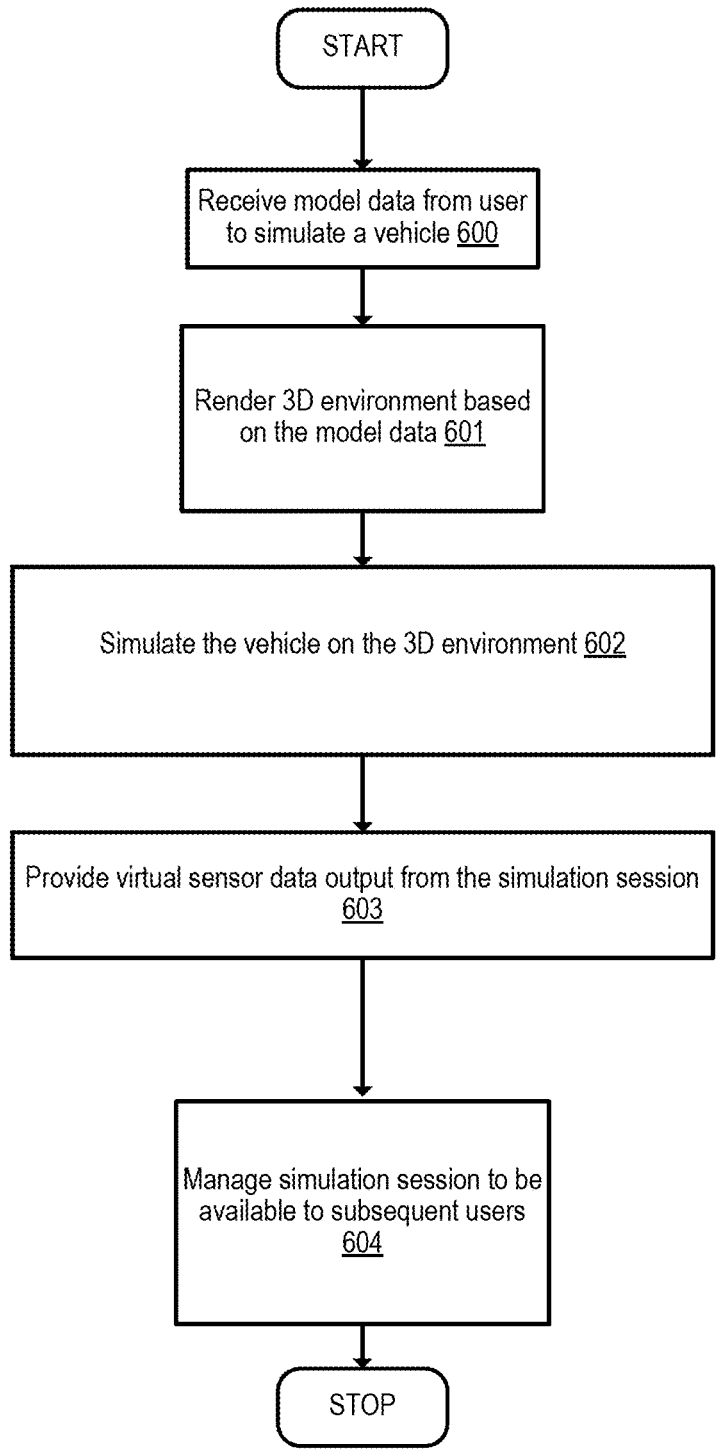
FIG. 6 illustrates a flow diagram for the simulation server, in accordance with an example implementation.

FIG. 6 illustrates a flow diagram for the simulation server, in accordance with an example implementation. At 600, the communication server 120 receives model data from a user device to simulate a vehicle. The model data can be in the form of data as illustrated in FIG. 4, or can involve information that points to specific entries in DB 104 to retrieve data from the DB 104.

At 601, the communication server 120 instructs the environment server 122 to render a 3D environment based on the data. In an example implementation, the communication server 120 can instruct an initialization server 121 to select a test environment (e.g., as selected through front end GUI 110) with structure models to simulate the vehicle and to provide data to the environment server 122 (e.g., directly or through instructions to the DB server 125) to initialize the 3D environment for rendering according to the test environment and structure models. The initialization server 121 extracts the necessary data structures (e.g., maps 133, vehicle 131, building or object structures 132, locations 134) to provide to the experiment server 123 for initializing the 3D environment. The database 104 is managed by a database server 125 configured to facilitate access to vehicle physics of the vehicle and structure model database for the 3D environment to the experiment server 123 and the environment server 122.

At 602, the communication server 120 instructs the experiment server 123 to execute a simulation session to simulate the vehicle on the 3D environment based on the model data. In an example implementation, the experiment server 123 will model the physics of the vehicle based on the vehicle model information such as vehicle physics model 131, along with the map information 133 to determine the interactions between the vehicle and objects in the map. The actual rendering of the 3D environment can be conducted by the environment server 122 to display the 3D model results to the front end GUI 110.

At 603, the experiment server 123 provides virtual sensor data output from the simulation session. The virtual sensor data can be any type of desired sensor data (e.g., brake response, proximity to objects, speed, etc.) that the user desires to have fed back to the front end GUI 110.

At 604, the experiment server 123 manages the simulation session by transmitting the simulation session to the DB server 125 to be stored in the DB 104 and made available for subsequent users to simulate another vehicle through simulating their model data. Additionally, the communication server 120 can transmit the model data to a model management server 124 configured to store and recall physical vehicle models, structure models and maps in the database. The model management server 124 can be specifically configured to extract information for providing to the initialization server 121 to initialize the experiment server 123. Thus, when subsequent users submit other model data to simulate another vehicle in a new session, the stored simulation session can be used with the model data to simulate the another vehicle.

Figure 7:
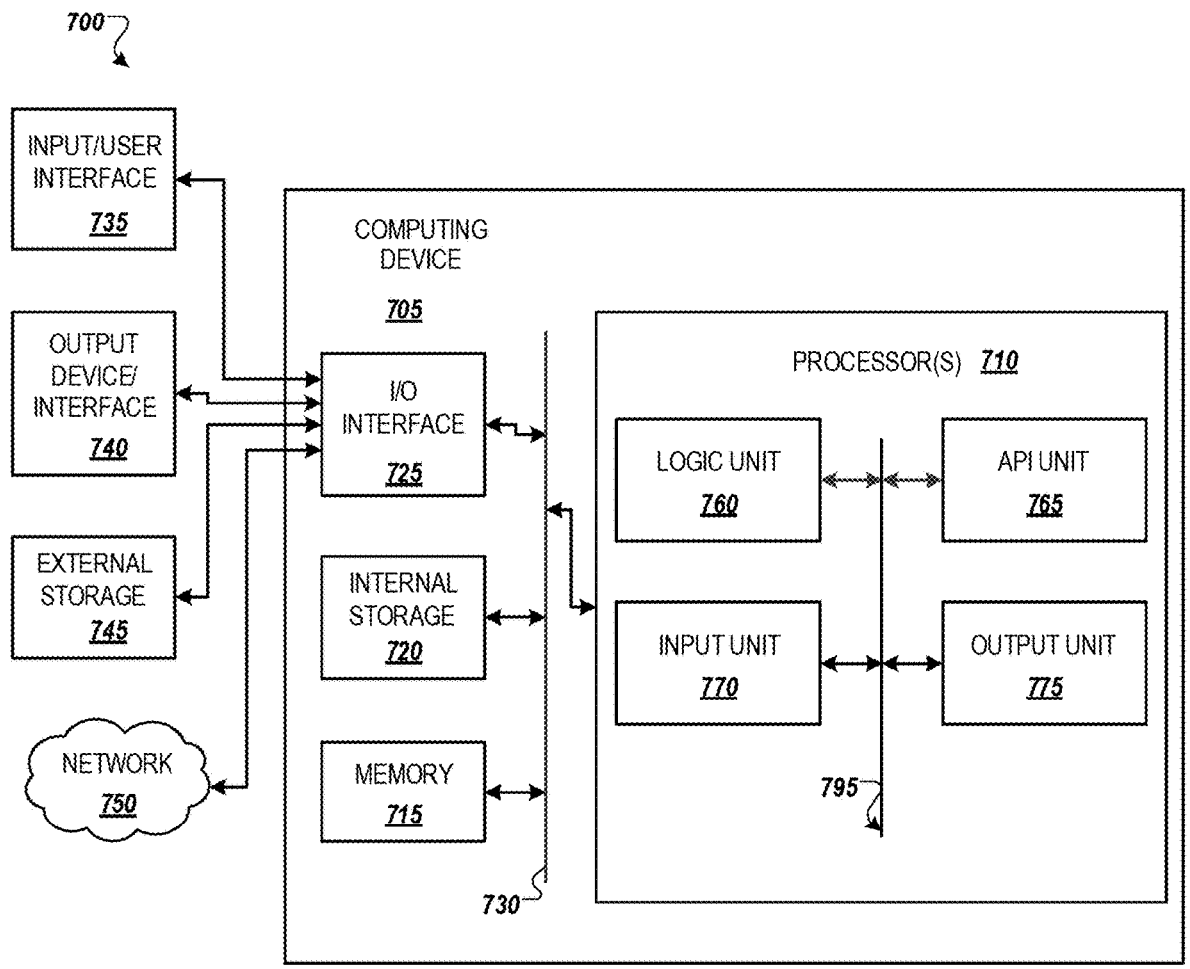
FIG. 7 illustrates an example computing environment with an example computer device suitable for use in example implementations.

FIG. 7 illustrates an example computing environment with an example computer device suitable for use in example implementations, such as the communication server 120, environment server 122, experiment server 123, initialization server 121, model management server 124, and database server 125. Computer device 705 in computing environment 700 can include one or more processing units, cores, or processors 710, memory 715 (e.g., RAM, ROM, and/or the like), internal storage 720 (e.g., magnetic, optical, solid state storage, and/or organic), and/or I/O interface 725, any of which can be coupled on a communication mechanism or bus 730 for communicating information or embedded in the computer device 705.

Computer device 705 can be communicatively coupled to input/user interface 735 and output device/interface 740. Either one or both of input/user interface 735 and output device/interface 740 can be a wired or wireless interface and can be detachable. Input/user interface 735 may include any device, component, sensor, or interface, physical or virtual, that can be used to provide input (e.g., buttons, touch-screen interface, keyboard, a pointing/cursor control, microphone, camera, braille, motion sensor, optical reader, and/or the like). Output device/interface 740 may include a display, television, monitor, printer, speaker, braille, or the like. In some example implementations, input/user interface 735 and output device/interface 740 can be embedded with or physically coupled to the computer device 705. In other example implementations, other computer devices may function as or provide the functions of input/user interface 735 and output device/interface 740 for a computer device 705. In example implementations involving a touch screen display, a television display, or any other form of display, the display is configured to provide a user interface as the front end GUI 110.

Examples of computer device 705 may include, but are not limited to, highly mobile devices (e.g., smartphones, devices in vehicles and other machines, devices carried by humans and animals, and the like), mobile devices (e.g., tablets, notebooks, laptops, personal computers, portable televisions, radios, and the like), and devices not designed for mobility (e.g., desktop computers, other computers, information kiosks, televisions with one or more processors embedded therein and/or coupled thereto, radios, and the like).

Computer device 705 can be communicatively coupled (e.g., via I/O interface 725) to external storage 745 and network 750 for communicating with any number of networked components, devices, and systems, including one or more computer devices of the same or different configuration. Computer device 705 or any connected computer device can be functioning as, providing services of, or referred to as a server, client, thin server, general machine, special-purpose machine, or another label.

I/O interface 725 can include, but is not limited to, wired and/or wireless interfaces using any communication or I/O protocols or standards (e.g., Ethernet, 802.11x, Universal System Bus, WiMax, modem, a cellular network protocol, and the like) for communicating information to and/or from at least all the connected components, devices, and network in computing environment 700. Network 750 can be any network or combination of networks (e.g., the Internet, local area network, wide area network, a telephonic network, a cellular network, satellite network, and the like).

Computer device 705 can use and/or communicate using computer-usable or computer-readable media, including transitory media and non-transitory media. Transitory media include transmission media (e.g., metal cables, fiber optics), signals, carrier waves, and the like. Non-transitory media include magnetic media (e.g., disks and tapes), optical media (e.g., CD ROM, digital video disks, Blu-ray disks), solid state media (e.g., RAM, ROM, flash memory, solid-state storage), and other non-volatile storage or memory.

Computer device 705 can be used to implement techniques, methods, applications, processes, or computer-executable instructions in some example computing environments. Computer-executable instructions can be retrieved from transitory media, and stored on and retrieved from non-transitory media. The executable instructions can originate from one or more of any programming, scripting, and machine languages (e.g., C, C++, C #, Java, Visual Basic, Python, Perl, JavaScript, and others).

Memory 715 may be configured to store or manage algorithms to be executed by processor(s) 710 as described in the flow, for example, at FIGS. 5 and 6. The example implementations as described herein may be conducted singularly, or in any combination of each other according to the desired implementation and are not limited to a particular example implementation.

Processor(s) 710 can execute under any operating system (OS) (not shown), in a native or virtual environment. One or more applications can be deployed that include logic unit 760, application programming interface (API) unit 765, input unit 770, output unit 775, and inter-unit communication mechanism 795 for the different units to communicate with each other, with the OS, and with other applications (not shown). The described units and elements can be varied in design, function, configuration, or implementation and are not limited to the descriptions provided. Processor(s) 710 can be in the form of physical processors or central processing units (CPU) that is configured to execute instructions loaded from Memory 715.

In some example implementations, when information or an execution instruction is received by API unit 765, it may be communicated to one or more other units (e.g., logic unit 760, input unit 770, output unit 775). In some instances, logic unit 760 may be configured to control the information flow among the units and direct the services provided by API unit 765, input unit 770, output unit 775, in some example implementations described above. For example, the flow of one or more processes or implementations may be controlled by logic unit 760 alone or in conjunction with API unit 765. The input unit 770 may be configured to obtain input for the calculations described in the example implementations, and the output unit 775 may be configured to provide output based on the calculations described in example implementations.

Some portions of the detailed description are presented in terms of algorithms and symbolic representations of operations within a computer. These algorithmic descriptions and symbolic representations are the means used by those skilled in the data processing arts to convey the essence of their innovations to others skilled in the art. An algorithm is a series of defined steps leading to a desired end state or result. In example implementations, the steps carried out require physical manipulations of tangible quantities for achieving a tangible result.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It will be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application will be apparent to those skilled in the art from consideration of the specification and practice of the teachings of the present application. Various aspects and/or components of the described example implementations may be used singly or in any combination. It is intended that the specification and example implementations be considered as examples only, with the true scope and spirit of the present application being indicated by the following claims.

What is claimed is:

1. A method for facilitating an online self-driving car test and development system, comprising:
    receiving first model data from a first user to simulate a vehicle;
    utilizing an environment server to render a 3D environment based on the first model data;
    utilizing an experiment server separate from the environment server to execute a simulation session to simulate the vehicle on the 3D environment based on the first model data;
    providing virtual sensor data output from the simulation session; and
    managing the simulation session in a database to be available to subsequent users submitting second model data to simulate another vehicle.

2. The method of claim 1, further comprising utilizing an initialization server to select a test environment with structure models to simulate the vehicle and to provide data to the environment server to initialize the 3D environment for rendering according to the test environment and structure models.

3. The method of claim 1, further comprising transmitting the first model data to a model management server configured to store and recall physical vehicle models, structure models and maps in the database.

4. The method of claim 1, wherein the method is implemented on a communication server configured to facilitate communications between a client device and the environment server, the experiment server and the database.

5. The method of claim 1, wherein the database is managed by a database server configured to facilitate access to vehicle physics of the vehicle and structure model database for the 3D environment to the experiment server and the environment server.

6. The method of claim 1, further comprising:
    for the subsequent users submitting second model data to simulate the another vehicle, utilizing the simulation session and the second model data to simulate the another vehicle.

7. A non-transitory computer readable medium, storing instructions for executing a process for facilitating an online self-driving car test and development system, comprising:
    receiving first model data from a first user to simulate a vehicle;
    utilizing an environment server to render a 3D environment based on the first model data;
    utilizing an experiment server separate from the environment server to execute a simulation session to simulate the vehicle on the 3D environment based on the first model data;
    providing virtual sensor data output from the simulation session; and
    managing the simulation session in a database to be available to subsequent users submitting second model data to simulate another vehicle.

8. The non-transitory computer readable medium of claim 7, the instructions further comprising utilizing an initialization server to select a test environment with structure models to simulate the vehicle and to provide data to the environment server to initialize the 3D environment for rendering according to the test environment and structure models.

9. The non-transitory computer readable medium of claim 7, the instructions further comprising transmitting the first model data to a model management server configured to store and recall physical vehicle models, structure models and maps in the database.

10. The non-transitory computer readable medium of claim 7, wherein the instructions are implemented on a communication server configured to facilitate communications between a client device and the environment server, the experiment server and the database.

11. The non-transitory computer readable medium of claim 7, wherein the database is managed by a database server configured to facilitate access to vehicle physics of the vehicle and structure model database for the 3D environment to the experiment server and the environment server.

12. The non-transitory computer readable medium of claim 7, the instructions comprising:
for the subsequent users submitting second model data to simulate the another vehicle, utilizing the simulation session and the second model data to simulate the another vehicle.

13. An online self-driving car test and development system, comprising:
a communication server configured to receive first model data from a first user to simulate a vehicle;
an environment server separate from the communication server configured to render a 3D environment based on the first model data;
an experiment server separate from the communication server and the environment server configured to execute a simulation session to simulate the vehicle on the 3D environment based on the first model data; and
a database configured to manage the simulation session in a database to be available to subsequent users submitting second model data to simulate another vehicle
wherein the communication server provides virtual sensor data output from the simulation session of the experiment server to a client device associated with the first user.

14. The system of claim 13, further comprising an initialization server configured to select a test environment with structure models to simulate the vehicle and to provide data to the environment server to initialize the 3D environment for rendering according to the test environment and structure models.

15. The system of claim 13, wherein the communication server is configured to transmit the first model data to a model management server configured to store and recall physical vehicle models, structure models and maps in the database.

16. The system of claim 13, wherein the database is managed by a database server configured to facilitate access to vehicle physics of the vehicle and structure model database for the 3D environment to the experiment server and the environment server.

17. The system of claim 13, wherein the communication server is configured to, for the subsequent users submitting second model data to simulate the another vehicle, utilize the simulation session and the second model data to simulate the another vehicle.

* * * * *